United States Patent
Jung et al.

(10) Patent No.: US 6,911,382 B2
(45) Date of Patent: Jun. 28, 2005

(54) METHOD OF FORMING A CONTACT IN A SEMICONDUCTOR DEVICE UTILIZING A PLASMA TREATMENT

(75) Inventors: Byung Hyun Jung, Seoul (KR); Bo Min Seo, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/721,978

(22) Filed: Nov. 25, 2003

(65) Prior Publication Data

US 2004/0127017 A1 Jul. 1, 2004

(30) Foreign Application Priority Data

Dec. 30, 2002 (KR) .................................. 10-2002-0086347

(51) Int. Cl.⁷ .......................................... H01L 21/425
(52) U.S. Cl. ...................... 438/533; 438/639; 438/667
(58) Field of Search ............................... 438/530, 533, 438/627, 637, 639, 643, 653, 667, 675; 257/773, 774

(56) References Cited

U.S. PATENT DOCUMENTS

| | | | | |
|---|---|---|---|---|
| 5,514,900 A | * | 5/1996 | Iranmanesh | 257/530 |
| 5,627,098 A | * | 5/1997 | Iranmanesh | 438/600 |
| 6,362,012 B1 | * | 3/2002 | Chi et al. | 438/3 |
| 6,468,858 B1 | * | 10/2002 | Lou | 438/253 |
| 6,686,288 B1 | * | 2/2004 | Prall et al. | 438/706 |
| 6,790,723 B2 | * | 9/2004 | Tanaka et al. | 438/243 |
| 6,797,619 B2 | * | 9/2004 | Jang et al. | 438/685 |

* cited by examiner

Primary Examiner—Alonzo Chambliss
Assistant Examiner—Monique Brunson
(74) Attorney, Agent, or Firm—Hanley, Flight & Zimmerman, LLC

(57) ABSTRACT

Semiconductor devices and methods to form a contact of a semiconductor device are disclosed. An example method to form a contact includes forming an insulating layer on a substrate; etching the insulating layer to form a contact hole; depositing a silicon layer on sidewalls and an undersurface of the contact hole; forming a silicon spacer on the sidewalls of the contact hole by etching the silicon layer; transforming the silicon spacer to a silicon nitride spacer; depositing a diffusion barrier on the silicon nitride spacer; and filling the contact hole with tungsten. Because the silicon nitride spacer formed on the sidewalls of the contact hole can serve as a leakage current blocking layer, the yield and the reliability of the semiconductor devices manufactured by this example process are enhanced.

17 Claims, 2 Drawing Sheets

METHOD OF FORMING A CONTACT IN A SEMICONDUCTOR DEVICE UTILIZING A PLASMA TREATMENT

FIELD OF THE DISCLOSURE

This disclosure relates generally to semiconductor devices, and, more particularly, to methods to form a contact of a semiconductor device.

BACKGROUND

As is well known, the demand for semiconductor devices has been increasing. Various types of contacts, (e.g., contact holes), have been recently developed for semiconductor devices. The contact hole is usually filled with a conductive metal, (e.g., tungsten), to thereby electrically connect a silicon substrate with a wiring board.

FIG. 1 is a cross-sectional view of a contact of a conventional semiconductor device. A conventional method for forming the contact of the semiconductor device will now be described:

An insulating layer is formed on a substrate 1. The insulating layer is then etched to thereby form a contact hole 2. An active region of the substrate 1 is exposed through the contact hole 2. A tungsten diffusion barrier 3, (e.g., a CVD TiN (chemical vapor deposition titanium nitride) layer), is deposited on the sidewalls and an undersurface of the contact hole 2. Thereafter, the contact hole 2 is filled with tungsten by depositing tungsten on the tungsten diffusion barrier 3 to thereby form a tungsten plug 4. Subsequently, an Al line 5 is deposited on the tungsten plug 4.

The above-mentioned deposition of the CVD TiN layer is usually executed by a MOCVD (metal-organic chemical vapor deposition) method. As a result, many impure atoms, (e.g., C, N, O and the like), are left in the CVD TiN layer. Leakage current can flow through these impure atoms. To reduce the leakage current, attributes of the CVD TiN layer may be enhanced by performing an $N_2/H_2$ plasma treatment. That is, the impure atoms in the CVD TiN layer can be reduced by the $N_2/H_2$ plasma treatment.

However, because of the anisotropic property of the $N_2/H_2$ plasma treatment, the sidewalls of the contact hole 2 cannot be treated with the $N_2/H_2$ plasma treatment. Since the attributes of the sidewalls of the contact .hole 2 are not enhanced by the $N_2/H_2$ plasma treatment, the leakage current may flow through the sidewalls. Therefore, the yield and the reliability of the manufactured semiconductor devices are degraded.

DETAILED DESCRIPTION

Figure 1:
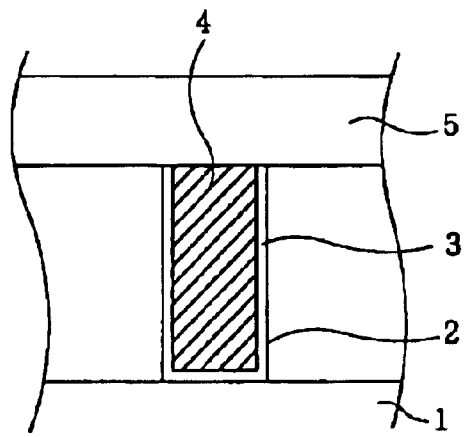
FIG. 1 is a cross-sectional view of a contact of a conventional semiconductor device.
Figure 2A:
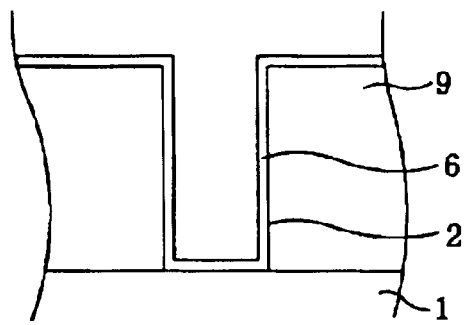
FIGS. 2A to 2E illustrate an example method for forming a contact of an example semiconductor device.

FIGS. 2A to 2E are cross-sectional views of an example contact of an example semiconductor device at various formation stages. As shown in FIG. 2A, an insulating layer 9 is first formed on a substrate 1. The insulating layer 9 is then etched to thereby form a contact hole 2 with a high aspect ratio. An active region of the substrate 1 is exposed through the contact hole 2.

As shown in FIG. 2A, a silicon layer 6 is deposited on the sidewalls and an undersurface of the contact hole 2 and on the insulating layer 9 with a thickness of, for example, about 50~200 Å in a furnace. At the time of depositing the silicon layer 6, it is preferable that temperature range and the pressure range in the furnace are about 500~700° C. and about 0.1~1 Torr, respectively. It is also preferred that $SiH_4$ gas be injected into the furnace at the time of depositing the silicon layer at a rate of about 1~5 slm (standard liters per minute).

Figure 2B:
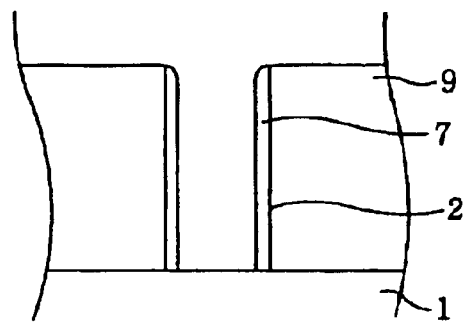

Thereafter, as shown in FIG. 2B, the silicon layer 6 is anisotropically etched in a chamber in a $Cl_2$/HBr gas atmosphere to thereby form a Si spacer 7 only on the sidewalls of the contact hole 2. The pressure range in the chamber is preferably, for example, about 1~50 mTorr during this etching process. Preferably the rates of the amounts of $Cl_2$ and HBr injected into the chamber range are about 10~50 sccm (standard cubic centimeters per minute) and about 100~300 sccm, respectively.

Figure 2C:
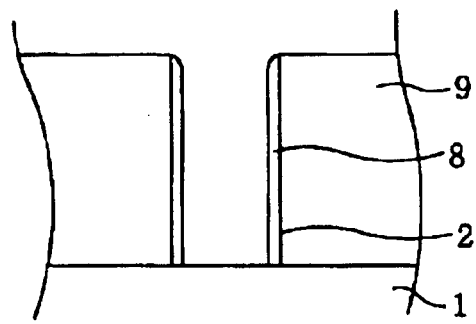

Thereafter, as shown in FIG. 2C, the Si spacer 7 undergoes a $NH_3$ plasma treatment in the chamber by using an ICP (inductive coupled plasma) scheme, to thereby transform the Si spacer 7 into a SiN spacer 8 on the sidewalls of the contact hole 2, (i.e., to nitrify the Si spacer 7). It is preferable that the pressure range and the rate of injection of the $NH_3$ gas atmosphere in the chamber are about 1~100 mTorr and about 10~100 sccm, respectively. Leakage current flowing through the sidewalls of the contact hole 2 can be greatly reduced by forming the SiN spacer 8 on the sidewalls of the contact hole 2.

It is also possible that, instead of the $NH_3$ plasma treatment, the SiN spacer 8 can be formed by annealing the SiN spacer 7 through a $N_2$ or $NH_3$ gas atmosphere heat treatment. It is preferable that the rate of $N_2$ or $NH_3$ gas injected into the chamber is about 5~20 slm and the temperature range in the chamber is about 600~800° C.

Figure 2D:
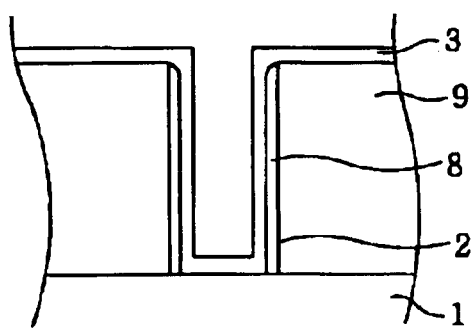

Thereafter, as shown in FIG. 2D, a CVD TiN layer 3 is deposited on the SiN spacer 8. The SiN spacer 8 serves as a tungsten diffusion barrier. It is preferable that the thickness of the deposited CVD TiN layer 3 is about 25~150 Å. The deposition of the CVD TiN layer 3 on the sidewalls of the contact hole 2 is executed by a MOCVD method. As a result, many impure atoms such as C, N, O and the like are contained in the sidewalls. To prevent leakage current from flowing through the impure atoms, attributes of the CVD TiN layer 3 may be enhanced by $N_2/H_2$ plasma treatment. Although, in the course of the $N_2/H_2$ plasma treatment, the sidewalls of the contact hole 2 cannot be treated because of anisotropic property of the $N_2/H_2$ plasma treatment, leakage current is not caused by the impure atoms, because the SiN spacer 8 formed on the sidewalls of the contact hole 2 serves as a leakage current blocking layer. Therefore, the yield and the reliability of the manufactured semiconductor devices are enhanced.

Figure 2E:
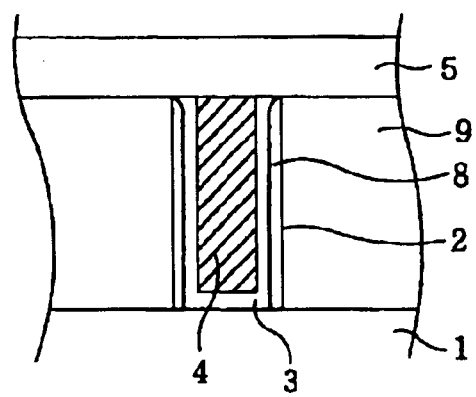

As shown in FIG. 2E, tungsten is deposited on the CVD TiN layer 3 so that the contact hole 2 is filled with tungsten. Thereafter, the tungsten outside of the contact hole 2 is removed by a tungsten CMP (chemical mechanical polishing) process, to thereby form a tungsten plug 4 in the contact hole 2. An Al line 5 is then deposited on the tungsten plug 4.

From the foregoing, persons of ordinary skill in the art will appreciate that example semiconductor devices having a contact hole with a leakage current blocking layer and example methods for forming a contact with a SiN (silicon nitride) layer serving as a leakage current blocking layer deposited on sidewalls of the contact hole have been disclosed.

An example method for forming a contact includes: forming an insulating layer on a substrate; etching the insulating layer to form a contact hole; depositing a silicon layer on sidewalls and an undersurface of the contact hole; forming a silicon spacer on the sidewalls of the contact hole by etching the silicon layer anisotropically in a chamber; transforming the silicon spacer into a silicon nitride spacer by plasma treatment in the chamber; depositing a diffusion barrier on the silicon nitride spacer; and filling the contact hole with tungsten.

An example method for forming a contact includes: forming an insulating layer on a substrate; etching the insulating layer to form a contact hole; depositing a silicon layer on sidewalls and an undersurface of the contact hole; forming a silicon spacer on the sidewalls of the contact hole by etching the silicon layer anisotropically in a chamber; forming a silicon nitride spacer by annealing the silicon spacer through a $N_2$ or $NH_3$ gas atmosphere heat treatment in the chamber; depositing a diffusion barrier on the silicon nitride spacer; and filling the contact hole with tungsten.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method to form a contact comprising:

forming an insulating layer on a substrate;

etching the insulating layer to form a contact hole;

depositing a silicon layer on sidewalls and an undersurface of the contact hole;

forming a silicon spacer on the sidewalls of the contact hole by etching the silicon layer;

plasma treating the silicon spacer to form a silicon nitride spacer;

depositing a diffusion barrier on the silicon nitride spacer; and filling the contact hole with tungsten.

2. A method as defined in claim 1, wherein depositing the silicon layer on the sidewalls and the undersurface of the contact hole comprises depositing the silicon layer on the sidewalls and the undersurface of the contact hole in a furnace at a temperature of approximately 50~700° C. and a pressure of approximately 0.1~1 Torr.

3. A method as defined in claim 2, wherein depositing the silicon layer on the sidewalls and then undersurface of the contact hole further comprises injecting approximately 1~5 standard liters per minute of $SiH_4$ gas into the furnace.

4. A method as defined in claim 1, wherein forming the silicon spacer on the sidewalls of the contact hole by etching the silicon layer further comprises anisotropic etching the silicon layer in a chamber of $Cl_2$ and HBr gases atmosphere.

5. A method as defined in claim 1, wherein forming the silicon spacer on the sidewalls of the contact hole by etching the silicon layer further comprises injecting approximately 10~50 sccm of $Cl_2$ and approximately 100~300 sccm of HBr into a chamber.

6. A method as defined in claim 5 wherein the pressure in the chamber is approximately 1~50 mTorr.

7. A method as defined in claim 1, wherein plasma treating the silicon spacer to form the silicon nitride spacer comprises $NH_3$ plasma treating the silicon spacer by increasing a density of the $NH_3$ plasma in a chamber.

8. A method as defined in claim 1, wherein plasma treating the silicon spacer to form the silicon nitride spacer comprises and $NH_3$ plasma treatment which adopts an inductive coupled plasma scheme.

9. A method as defined in claim 1, wherein plasma treating the silicon spacer to form the silicon nitride spacer comprises plasma treating the silicon spacer at a pressure of approximately 1~100 mTorr and injecting an $NH_3$ gas atmosphere into a chamber at approximately 10~100 sccm.

10. A method as defined in claim 1, wherein the diffusion barrier prevents tungsten from being diffused.

11. A method to form a contact comprising:

forming an insulating layer on a substrate;

etching the insulating layer to form a contact hole;

depositing a silicon layer on sidewalls and an undersurface of the contact hole;

forming a silicon spacer on the sidewalls of the contact hole by etching the silicon layer;

annealing the silicon spacer through a $N_2$ or $NH_3$ gas atmosphere heat treatment to form a silicon nitride spacer;

depositing a diffusion barrier on the silicon nitride spacer; and filling the contact hole with tungsten.

12. A method as defined in claim 11, wherein depositing the silicon layer on the sidewalls and the undersurface of the contact hole comprises depositing the silicon layer in a furnace at a temperature of approximately 500~70° C. and a pressure of approximately 0.1~1 Torr.

13. A method as defined in claim 12 wherein depositing the silicon layer comprises injecting $SiH_4$ gas into the furnace at approximately 1~5 slm.

14. A method as defined in claim 11, wherein etching the silicon layer comprises anisotropic etching the silicon layer in a chamber of $Cl_2$ and HBr gases atmosphere.

15. A method as defined in claim 14, wherein the $Cl_2$ is injected into the chamber at approximately 10~50 sccm and the HBr is injected into the chamber at approximately 100~300 sccm, and wherein a pressure of the chamber is approximately 1~50 mTorr.

16. A method as defined in claim 11, wherein the $N_2$ or $NH_3$ gas is injected into the chamber at approximately 5~20 slm and wherein the temperature in the chamber is approximately 600~800° C.

17. A method as defined in claim 11, wherein the diffusion barrier prevents tungsten from being diffused.

* * * * *